United States Patent [19]

Lucey

[11] 4,282,269

[45] Aug. 4, 1981

[54] ELECTRONIC COMPONENT WITH RADIATION-HARDENABLE COATING

[75] Inventor: Michael F. Lucey, North Adams, Mass.

[73] Assignee: Sprague Electric Company, North Adams, Mass.

[21] Appl. No.: 167,907

[22] Filed: Jul. 14, 1980

[51] Int. Cl.$^3$ .............................................. B05D 3/06
[52] U.S. Cl. .............................. 427/54.1; 204/159.23;
[58] Field of Search ............................ 427/54.1, 53.1; 204/159.23; 430/270

[56] References Cited

U.S. PATENT DOCUMENTS

| 3,897,322 | 7/1975 | Marek et al. . |
| 3,990,395 | 11/1976 | Evans et al. . |
| 4,012,304 | 3/1977 | Marek et al. . |
| 4,039,905 | 8/1977 | Pearce et al. . |
| 4,146,916 | 3/1979 | Breeden et al. . |

FOREIGN PATENT DOCUMENTS

| 2324653 | 4/1977 | France . |
| 52-37934 | 3/1977 | Japan . |
| 52-53940 | 4/1977 | Japan . |
| 54-8007 | 1/1979 | Japan . |

*Primary Examiner*—John H. Newsome
*Attorney, Agent, or Firm*—Connolly and Hutz

[57] ABSTRACT

An electronic component is coated with a radiation-curable resin composition containing a borate to reduce the cure time and increase the thickness of the coating that can be cured.

18 Claims, 2 Drawing Figures

ELECTRONIC COMPONENT WITH RADIATION-HARDENABLE COATING

BACKGROUND OF THE INVENTION

This invention relates to electronic components coated with an ultraviolet radiation-curable composition containing a borate that not only accelerates the cure but promotes the curing of thicker films than heretofore possible.

Electronic components have been coated with a variety of materials for a variety of reasons. Some of these have been soft undercoatings to protect the component from shock. Others have protected the component from dirt, moisture, and other contaminants. Still others have provided rigidity.

Changes in manufacturing conditions have necessitated changes in coatings. For example, aqueous fluxes are replacing nonaqueous ones in soldering components to boards. However, aqueous fluxes penetrate many of the coatings in use, and so new coating formulations must be devised.

Electronic components are being used in environments where they had not been used before. Components used in electronic ignition systems must withstand not only elevated temperatures from automotive engines but also salt water spray from road salt.

Manufacturing processes are being evaluated or re-evaluated with emphasis on energy requirements of the process as well as simplicity of operation.

SUMMARY OF THE INVENTION

It is a feature of this invention to provide an electronic component with a chemically-resistant coating that can be readily applied. Another feature is that the coating process of this invention can be easily integrated into present manufacturing schemes and is not energy-intensive.

The foregoing and other features of this invention are attained through the use of an ultraviolet radiation curable coating composition containing a borate. The borate acts to decrease the cure time while increasing the thickness of films that are cured, with respect to prior art films. Pigments and other additives may be incorporated for use with specific electronic components.

The mechanism by which the borate acts is not known. Metal oxides improve the adhesion of resins to metal, and borates react with glycolic compounds to crosslink or transesterify them. A borate added to the resin mixture being used to coat a capacitor section provided the surprising result that the thickness of a resin film that could be cured in a reduced time was increased while the pot life of the mixture was not affected. It was believed that if the borate was rapidly crosslinking or transesterifying the material to allow the thicker coating to cure at reduced time, then the material should set up in the reservoir. However, this did not happen and, for some applications a silica thickener was needed.

The composition includes a photoinitiator that may be any of the known photoinitiators including anthracene, 2-chloro-anthraquinone, and 2,2-dimethoxy-2-phenylacetophenone. Thermal initiators such as lauryl peroxide may also be included in addition to the photo initiator.

DESCRIPTION OF THE PREFERRED EMBODIMENTS

The preferred radiation is ultraviolet light, and the preferred materials are ultraviolet light-curable acrylate compositions that are substituted with either epoxy or urethane groups and which contain a borate. The epoxy is a nonvolatile diacrylate ester of a bisphenol-A epoxy resin, and is mixed with a diol diacrylate (specifically 1,6-hexanediol diacrylate), and an acetophenone photoinitiator (specifically 2,2-dimethoxy-2-phenylacetophenone). The urethane is an acrylic urethane and is mixed with a monoacrylate, a diacrylate, and a photoinitiator.

It appears that it is the borate anion that is important and that the cation does not affect the results, or if it does so, it is of secondary importance. Borates, although named as simple compounds, frequently have more complicated structures. One compound that proved effective in this invention is a zinc borate that appears to have the formula $2ZnO.3B_2O_3.3.5H_2O$; calcium and barium metaborates also have proved effective.

Figure 1:
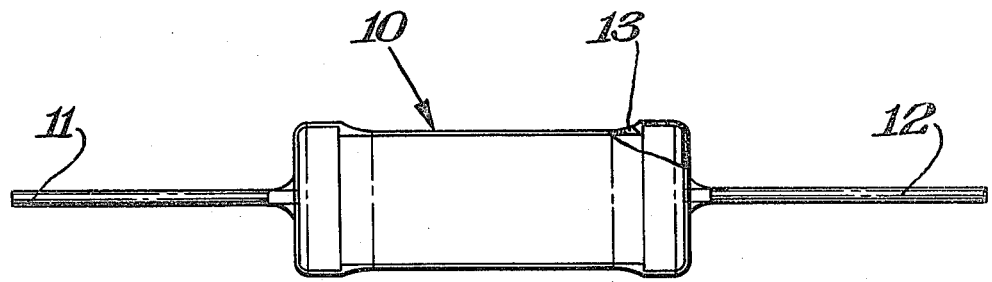
FIG. 1 shows an electronic component coated with a coating of the present invention.

FIG. 1 of the drawing shows an axial lead capacitor 10 with leads 11, 12 attached thereto and with the coating 13 of this invention thereon. The coating 13 can be applied as a roll-coat, or by dipping, or by spraying. The components that can be coated include wound metallized film capacitors, extended foil capacitors, solid tantalum pellet capacitors, tubular ceramcs, and stacked film-foil capacitors. The coating 13 has been used in place of an epoxy end coat over cans with bungs or covers to prevent solvent ingress. The coating has been formulated into a printing ink and used on heat-shrinkable sleeves.

When a thixotrope is needed, fumed silica, particularly that sold under the name of Cab-O-Sil, can be added to the coating 13 without impairing the cure.

The coating 13 may be applied as a single coat or built-up as two or more coats. The latter is preferable when the final coat is to contain dyes or pigments. In this case, the first coat is clear, allowing visual inspection of completeness of coverage, and then subsequent coats containing dyes or pigments that do not interfere with the ultraviolet curing are applied and cured.

Figure 2:
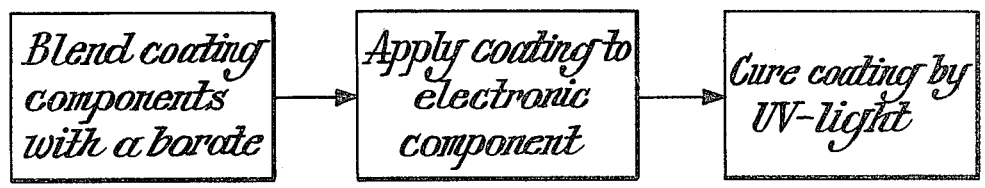
FIG. 2 is a block diagram of the process of the present invention.

FIG. 2 depicts the steps involved in the process of this invention, whereby the coating components are blended with a borate, then the resulting mixture is applied to an electronic component as a coating, and then the coating is cured by exposure to ultraviolet radiation.

The coating mixture is prepared by blending together an epoxy acrylate or an acrylic urethane with a mono- and/or di-acrylate diluent, a photoinitiator, and a borate. When a thixotrope is needed, it is also blended into the mix. More diluent is used when the mix is to be applied with a spray gun than by roll-coating. The composition may be applied by dipping, painting, spraying, or roll-coating.

When roll-coating is the application method, the parts are placed on a two-chain conveyor system, passed through a heating chamber to drive off entrapped air from the parts, then presented to a flanged wheel that dips into a reservoir containing the coating mixture and applies the coating to the parts, passed next to a dressing wheel to smooth the coating, and then exposed to uv-light for 10 to 15 sec. If a second coating is desired, the parts are passed directly from the uv-cure to a second flanged coating wheel, a second dressing wheel, and a second uv-light exposure. The flanged coating wheel is approximately 30 mils wider than the length of the part to be coated to apply coating to the ends. The depth of the flange is greater than one-half the diameter of the part. In the following examples, except when specified otherwise, the speed of the conveyor chains was such that the length of exposure to uv-light (cure time) was set at 11.4 sec.

EXAMPLE 1

In this example, axial lead wound metallized Mylar capacitors were coated with formulations based on a diacrylate of a bisphenol-A epoxy resin, hereinafter called epoxy diacrylate, with 1,6-hexanediol diacrylate as diluent, hereinafter called diol diacrylate, with 2,2-dimethoxy-2-phenylacetophenone, hereinafter called photoinitiator, and without and with zinc borate or calcium metaborate. UV-radiation of approximately 200 watts intensity was used. Percentages are percent by weight, and curing time is in seconds. In runs 1-8, the mixture was heated to make it flow.

TABLE 1a

| Run Number | 1 | 2 | 3 | 4 | 5 | 6 | 7 | 8 |
|---|---|---|---|---|---|---|---|---|
| Epoxy diacrylate | 96 | 96 | 96 | 93.8 | 81.6 | 70.2 | 62.1 | 62.6 |
| Diol diacrylate | 3.2 | 3.2 | 3.2 | 4.7 | 4.1 | 4.7 | 5.2 | 4.2 |
| Photoinitiator | 0.8 | 0.8 | 0.8 | 0.8 | 0.7 | 1.8 | 1.6 | 1.6 |
| Zinc borate | — | — | — | 0.8 | 13.6 | 23.4 | 31.1 | — |
| Calcium metaborate | — | — | — | — | — | — | — | 31.3 |

TABLE 1b

| Formulation | Cure time (sec) | Comments |
|---|---|---|
| 1 | 180 | Thick film hard after 3 min |
| 2 | 60 | Semi-dry, not hard, thick film |
| 3 | 60 | Semi-tacky hard thick film |
| 4 | 50 | Non-tacky, resilient, hard, thick film |
| 5 | 30 | Thicker film non-tacky, hard |
| 6 | 20 | Thinner film, non-tacky, hard |
| 7 | 10 | Hard, temperature & solvent resistant, thin film |
| 8 | 15 | Hard surface, underlayer not dry, thin film |

Thus, non-tacky hard coatings can be obtained in less time, i.e., 50 seconds or less, even to greater thickness, using a borate than for those not containing a borate. Increasing the borate concentration to 31% made the coatings more brittle but increased flame retardency.

The amount of borate and other ingredients vary with application mode. Up to 13% borate may be present if the coating is painted on; more can be present if the coating is sprayed on.

In Examples 2 through 4, samples were passed under the lamp on a conveyor system; machine speed was such that exposure time was 11.4 sec.

EXAMPLE 2

The following is typical of a formulation that is applied by roll-coating; it can also be applied by painting. The roll coat applies a coating of 0.005 inch (0.127 mm) thickness, and if greater thickness is required, more than one pass is made. The thickness of the painted coating was 0.075 inch (1.905 mm). A conveyer system passed the coated metallized Mylar capacitors under a 1300W ultra-violet light source; exposure time was 11.4 sec, and all coatings had completely cured in this time.

TABLE 2

|  | Roll coat | Painted coat |
|---|---|---|
| Epoxy diacrylate | 69.9% | 70.0% |
| Diol diacrylate | 21.1% | 22.0% |
| Photoinitiator | 2.2% | 0.9% |
| Zinc borate | 6.8% | 6.8% |

Once initiated, the cure will continue in the dark. Units with end caps were coated using the above formulation, and it crept or seeped under the end caps where it was not exposed to the ultraviolet light. However, it was cured there also. For ease of application of the roll coat, units are preheated before applying the coating, and generally to 125°–150° C.

Using the above formulation with 0.9% photo-initiator, tubular ceramic units were roll coated and completely cured in up to 11.4 sec. Similarly, tantalum pellets were dipped in the formulation and cured as were stacked polypropylene film-foil capacitors. The material was used as an end seal, i.e., it was pored onto the top of a metal container housing a capacitor and cured in up to 11.4 sec. This formulation containing acetone was used as a printing ink with added dye and printed on heat-shrinkable sleeves.

EXAMPLE 3

The formulation of Example 2 containing 0.9% initiator was diluted approximately 40% with the diol diacrylate giving an easily sprayable composition containing 30.0 wt% epoxy diacrylate, 63.8 wt% diol diacrylate, 0.5 wt% photoinitiator, and 5.7 wt% zinc borate. Capacitors spray coated with this composition were cured in less than 11.4 sec when exposed to ultraviolet light.

EXAMPLE 4

A series of test blocks varying in thickness from 40 mils to 445 mils (1.016 to 11.303 mm) were UV-cured using a 1300 W lamp and a formulation containing 0.7 wt% photoinitiator, 6.8 wt% zinc borate, 70 wt% epoxy diacrylate, and 22 wt% diol diacrylate. Cure time varied from less than 0.1 sec for the 40 mil sample to less than 15 sec for the 445 mil thickness sample.

It is also possible for curing to take place through glass. Very small parts were held in a jig that had a glass cover to hold them in place, and the coating was cured in less than 11.3 seconds as usual. The formulation will cure in visible light, e.g., coated specimens were left on a laboratory bench in a room with fluorescent lights and the coating cured. Electron beam irradiation would permit curing of greater thicknesses than ultraviolet light in the same time because of the greater penetrating power of the electron beam.

EXAMPLE 5

The effect of borate on the cure rate of other ultraviolet curable systems was investigated. A formulation containing 70 wt% of an acrylic urethane, 17.3 wt% ethoxy ethoxyethylacrylate (a monoacrylate), 5 wt% tetraethyleneglycol diacrylate, and 0.9 wt% photoinitiator, to which was added 6.8 wt% zinc borate, was cured in less than 0.1 sec as a 40 mil (1.016 mm) thick block under a 1300 W ultraviolet lamp.

What is claimed is:

1. An electronic component having a coating of an ultraviolet radiation-curable composition containing a borate to increase the cure rate and the thickness of the coating, said coating cured by exposure to ultraviolet light.

2. A component according to claim 1 wherein said component is chosen from the group of wound metallized film capacitors, wound extended foil capacitors, ceramic capacitors, stacked film-foil capacitors, and solid pellet capacitors.

3. A component according to claim 1 wherein said borate is chosen from the group of zinc borate, barium metaborate, and calcium metaborate.

4. A component according to claim 3 wherein said composition comprises an epoxy resin prepolymer, a multifunctional acrylate, and a photoinitiator.

5. A component according to claim 4 wherein said prepolymer is based on bisphenol-A, said acrylate is 1,6-hexanediol, and said photoinitiator is 2,2-dimethoxy-2-phenylacetophenone.

6. A component according to claim 5 wherein the amount of said prepolymer is in the range of 62 to 96 wt%, the amount of said acrylate is in the range of 4 to 35 wt%, the amount of photoinitiator is in the range of 0.5 to 2 wt%, and the amount of said borate is in the range of 0.8 to 31 wt%.

7. A component according to claim 6 wherein said composition also contains pigments, fillers, or mixtures thereof.

8. A component according to claim 3 wherein said composition comprises an acrylic urethane, a monoacrylate, a diacrylate, and a photoinitiator.

9. A component according to claim 8 wherein said monoacrylate is ethoxyethoxyethylacrylate, said diacrylate is tetraethyleneglycol diacrylate, and said borate is zinc borate.

10. A process of coating an electronic component comprising blending ultraviolet radiation-curable resin components with a borate to decrease cure time and to increase the thickness of the coating that can be cured, applying the resulting mixture to an electronic component as a coating, and then subjecting the coated component to exposure to ultraviolet radiation to cure said coating.

11. A process according to claim 10 wherein said exposure is for less than 30 seconds.

12. A process of coating an electronic component according to claim 10 wherein said resin components comprise an epoxy resin prepolymer, a multifunctional acrylate, and a photoinitiator.

13. A process for coating an electronic component according to claim 12 wherein said prepolymer is based on bisphenol-A, said acrylate is 1,6-hexanediol diacrylate, said photoinitiator is 2,2-dimethoxy-2-phenylacetophenone, and said borate is chosen from the group of zinc borate, calcium metaborate, and barium metaborate.

14. A process according to claim 10 wherein a thixotropic additive is present.

15. A process according to claim 10 wherein a first clear coating is applied and at least partially cured and subsequent coatings are applied and cured.

16. A process according to claim 15 wherein said subsequent coatings contain dyes or pigments.

17. A process according to claim 10 wherein said resin components comprise an acrylic urethane, a monoacrylate, a diacrylate, and a photoinitiator.

18. A process according to claim 17 wherein said monoacrylate is ethoxyethoxyethylacrylate, said diacrylate is tetraethyleneglycol diacrylate, and said borate is zinc borate.

* * * * *